(12) United States Patent
Pagaila

(10) Patent No.: US 9,431,316 B2
(45) Date of Patent: Aug. 30, 2016

(54) SEMICONDUCTOR DEVICE AND METHOD OF FORMING CHANNELS IN BACK SURFACE OF FO-WLCSP FOR HEAT DISSIPATION

(75) Inventor: Reza Argenty Pagaila, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 647 days.

(21) Appl. No.: 12/773,669

(22) Filed: May 4, 2010

(65) Prior Publication Data
US 2011/0272824 A1    Nov. 10, 2011

(51) Int. Cl.
| | |
|---|---|
| H01L 23/34 | (2006.01) |
| H01L 21/56 | (2006.01) |
| H01L 23/31 | (2006.01) |
| H01L 23/36 | (2006.01) |
| H01L 23/367 | (2006.01) |

(Continued)

(52) U.S. Cl.
CPC ......... *H01L 23/3128* (2013.01); *H01L 21/565* (2013.01); *H01L 21/568* (2013.01); *H01L 23/3121* (2013.01); *H01L 23/36* (2013.01); *H01L 23/3677* (2013.01); *H01L 24/19* (2013.01); *H01L 24/96* (2013.01); *H01L 25/0655* (2013.01); *H01L 29/0657* (2013.01); *H01L 23/481* (2013.01); *H01L 2224/12105* (2013.01); *H01L 2224/16145* (2013.01); *H01L 2224/73259* (2013.01); *H01L 2224/73265* (2013.01); *H01L 2225/06513* (2013.01); *H01L 2225/06541* (2013.01); *H01L 2924/0103* (2013.01); *H01L 2924/01004* (2013.01); *H01L 2924/014* (2013.01); *H01L 2924/01005* (2013.01); *H01L 2924/01013* (2013.01); *H01L 2924/01029* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/10158* (2013.01); *H01L 2924/12041* (2013.01); *H01L 2924/1306* (2013.01); *H01L 2924/13091* (2013.01); *H01L 2924/181* (2013.01); *H01L 2924/18161* (2013.01)

(58) Field of Classification Search
USPC ................................................. 438/122, 127
See application file for complete search history.

(56) References Cited

U.S. PATENT DOCUMENTS

| | | | | |
|---|---|---|---|---|
| 4,842,699 A | * | 6/1989 | Hua et al. | ..................... 205/126 |
| 5,250,843 A | | 10/1993 | Eichelberger | |

(Continued)

*Primary Examiner* — Robert Carpenter
(74) *Attorney, Agent, or Firm* — Robert D. Atkins; Patent Law Group: Atkins and Associates, P.C.

(57) ABSTRACT

A semiconductor device has semiconductor die mounted to a temporary carrier. An encapsulant is deposited over the die and carrier. A channel is formed in a back surface of the die, either while in wafer form or after mounting to the carrier. The channel corresponds to a specific heat generating area of the die. The channel can be straight or curved or crossing pattern. The carrier is removed. An interconnect structure is formed over the encapsulant and die. The semiconductor die are singulated through the encapsulant. A TIM and heat sink are formed over the channel and encapsulant. Alternatively, a conformal plating layer can be formed over the channel and encapsulant. A conductive via can be formed through the encapsulant, and TSV formed through the die. The die with channels can be mounted over a second semiconductor die which is mounted to the interconnect structure.

4 Claims, 16 Drawing Sheets

(51) Int. Cl.
  *H01L 23/00* (2006.01)
  *H01L 25/065* (2006.01)
  *H01L 29/06* (2006.01)
  *H01L 23/48* (2006.01)

(56) References Cited

U.S. PATENT DOCUMENTS

| | | | |
|---|---|---|---|
| 5,353,498 A | 10/1994 | Fillion et al. | |
| 5,841,193 A | 11/1998 | Echelberger | |
| 5,989,971 A * | 11/1999 | Tu et al. | 438/396 |
| 6,184,064 B1 * | 2/2001 | Jiang et al. | 438/113 |
| 6,225,695 B1 | 5/2001 | Chia et al. | |
| 6,541,352 B2 * | 4/2003 | Wachtler | 438/460 |
| 6,607,928 B1 * | 8/2003 | Eiles et al. | 438/16 |
| 7,029,951 B2 * | 4/2006 | Chen et al. | 438/122 |
| 7,064,010 B2 * | 6/2006 | Farnworth | H01L 21/56 257/E21.502 |
| 7,112,882 B2 | 9/2006 | Lee | |
| 7,179,670 B2 * | 2/2007 | Shelton et al. | 438/26 |
| 7,329,948 B2 * | 2/2008 | Sri-Jayantha et al. | 257/707 |
| 7,361,972 B2 | 4/2008 | Chen | |
| 7,432,592 B2 * | 10/2008 | Shi et al. | 257/714 |
| 7,514,291 B2 * | 4/2009 | Akram | B28D 1/221 257/E23.001 |
| 7,572,681 B1 * | 8/2009 | Huemoeller et al. | 438/125 |
| 7,619,901 B2 | 11/2009 | Eichelberger et al. | |
| 2004/0113283 A1 * | 6/2004 | Farnworth et al. | 257/782 |
| 2006/0278974 A1 | 12/2006 | Hsiao et al. | |
| 2007/0252255 A1 * | 11/2007 | Lam | 257/678 |

* cited by examiner

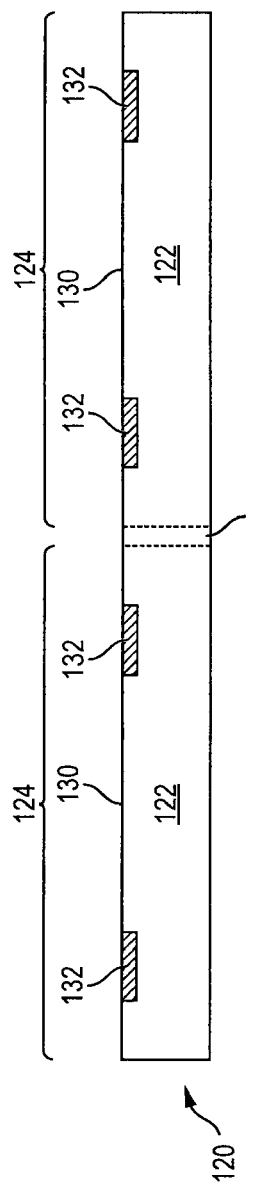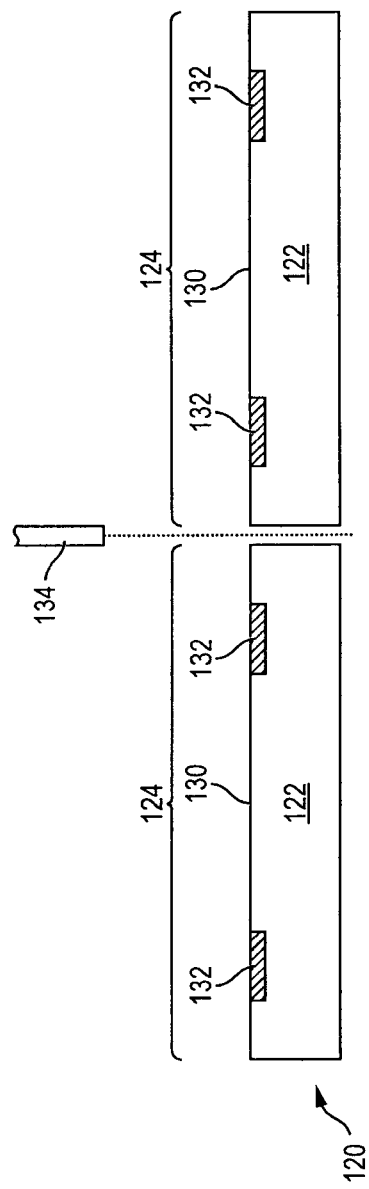

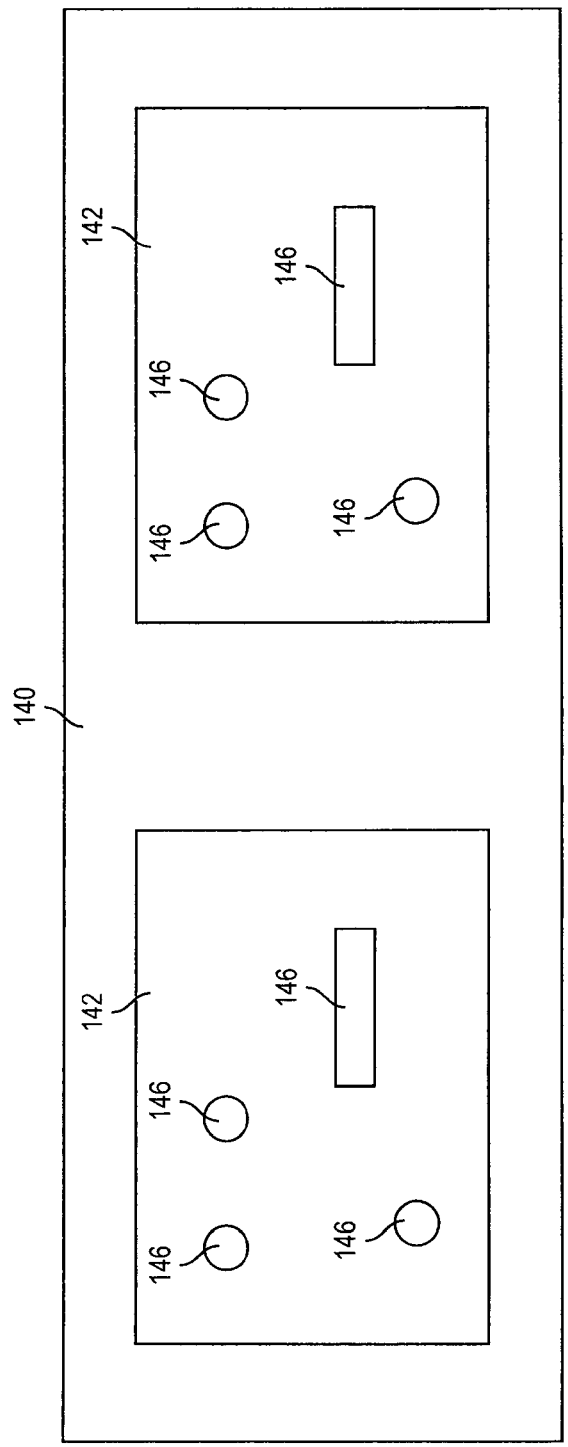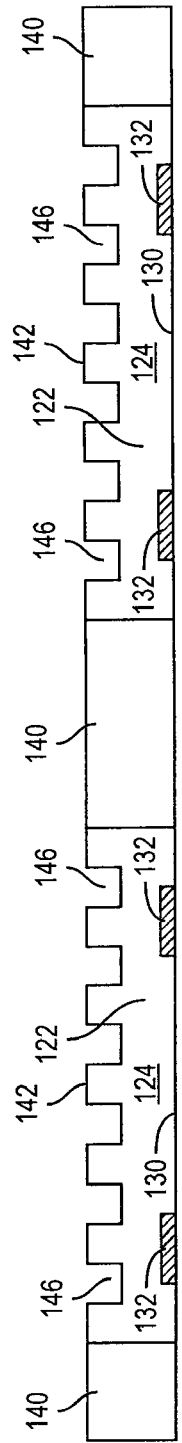
FIG. 5i
FIG. 5j

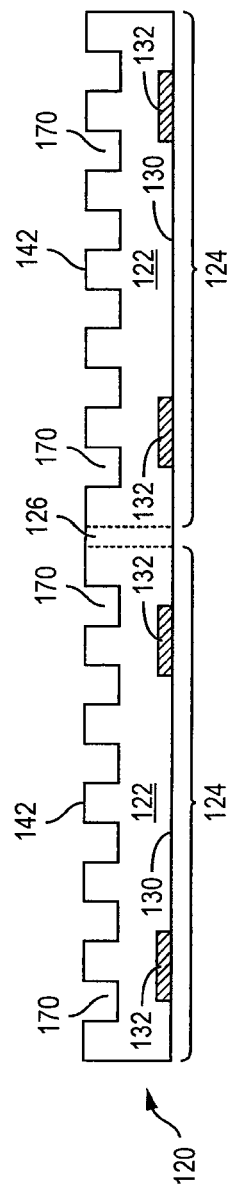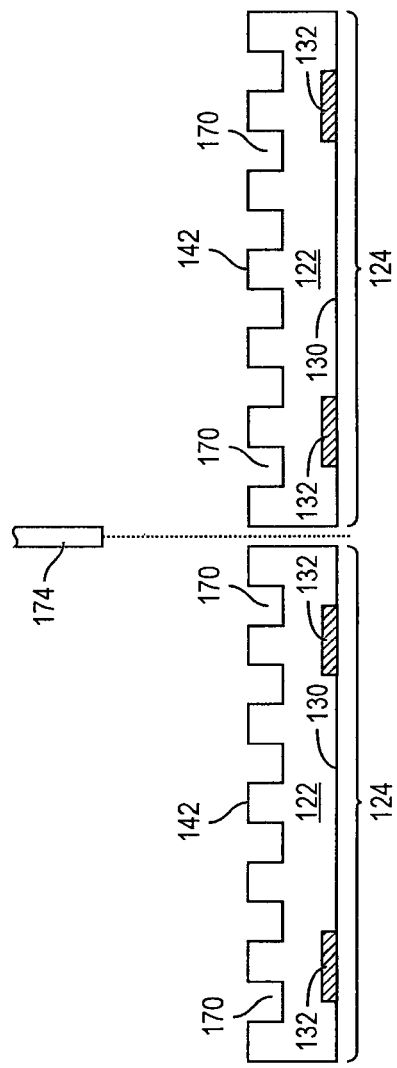
FIG. 7a
FIG. 7b

SEMICONDUCTOR DEVICE AND METHOD OF FORMING CHANNELS IN BACK SURFACE OF FO-WLCSP FOR HEAT DISSIPATION

FIELD OF THE INVENTION

The present invention relates in general to semiconductor devices and, more particularly, to a semiconductor device and method of forming channels in a back surface of a FO-WLCSP for heat dissipation.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

FIG. 1 shows a conventional semiconductor die 10 having active surface 12 and contact pads 14 mounted to interconnect structure 20. The interconnect structure 20 includes conductive layers 22 separated by insulating or dielectric material 24. A plurality of bumps 28 is formed over interconnect structure 20. An encapsulant 30 is formed over semiconductor die 10 and interconnect structure 20.

Semiconductor die 10 requires adequate heat dissipation during all phases of operation. High frequency and high current carrying semiconductor devices can generate excessive heat. Much of the heat generated by semiconductor die 10 is dissipated through encapsulant 30. However, encapsulant 30 is a poor thermal conductor. Without effective heat dissipation, the generated heat can reduce performance, decrease reliability, and reduce the useful lifetime of the semiconductor device.

SUMMARY OF THE INVENTION

A need exists to adequately dissipate heat generated by a semiconductor die. Accordingly, in one embodiment, the present invention is a method of making a semiconductor device comprising the steps of providing a temporary carrier, providing a plurality of semiconductor die each having an active surface, mounting the active surface of the semiconductor die to the temporary carrier, depositing an encapsulant over the semiconductor die and temporary carrier, and forming a channel in a back surface of the semiconductor die opposite the active surface. The channel corresponds to a heat generating area of the semiconductor die. The method further includes the steps of removing the temporary carrier to expose a first side of the encapsulant and the active surface of the semiconductor die, and forming an interconnect structure over the first side of the encapsulant and the active surface of the semiconductor die.

In another embodiment, the present invention is a method of making a semiconductor device comprising the steps of providing a carrier, providing a plurality of semiconductor die each having an active surface, and forming a channel in a back surface of the semiconductor die opposite the active surface. The channel corresponds to a heat generating area of the semiconductor die. The method further includes the steps of mounting the semiconductor die to the carrier, depositing an encapsulant over the semiconductor die and carrier, removing the carrier to expose a first side of the encapsulant and the active surface of the semiconductor die, and forming an interconnect structure over the first side of the encapsulant and the active surface of the semiconductor die.

In another embodiment, the present invention is a method of making a semiconductor device comprising the steps of providing a first semiconductor die, depositing an encapsulant over the first semiconductor die, and forming a channel in a back surface of the first semiconductor die. The channel corresponds to a heat generating area of the first semiconductor die. The method further includes the step of forming an interconnect structure over the first semiconductor die.

In another embodiment, the present invention is a semiconductor device comprising a first semiconductor die and encapsulant deposited over the first semiconductor die. A channel is formed in a back surface of the first semiconductor die. The channel corresponds to a heat generating area of the first semiconductor die. An interconnect structure is formed over the first semiconductor die.

BRIEF DESCRIPTION OF THE DRAWINGS

FIGS. 4a-4c illustrate a semiconductor wafer with a plurality of semiconductor die separated by a saw street;

FIGS. 5a-5l illustrate a process of forming channels in a back surface of the semiconductor die;

FIGS. 7a-7b illustrate a semiconductor wafer with a plurality of semiconductor die having channels formed in its back surface while in wafer form;

DETAILED DESCRIPTION OF THE DRAWINGS

Figure 1:
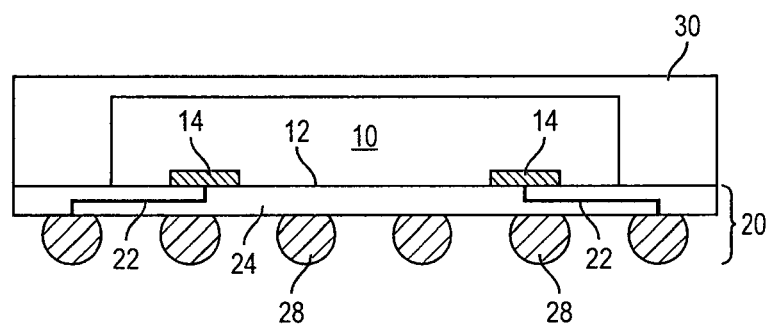
FIG. 1 illustrates a conventional semiconductor die with bottom-side build-up interconnect structure.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
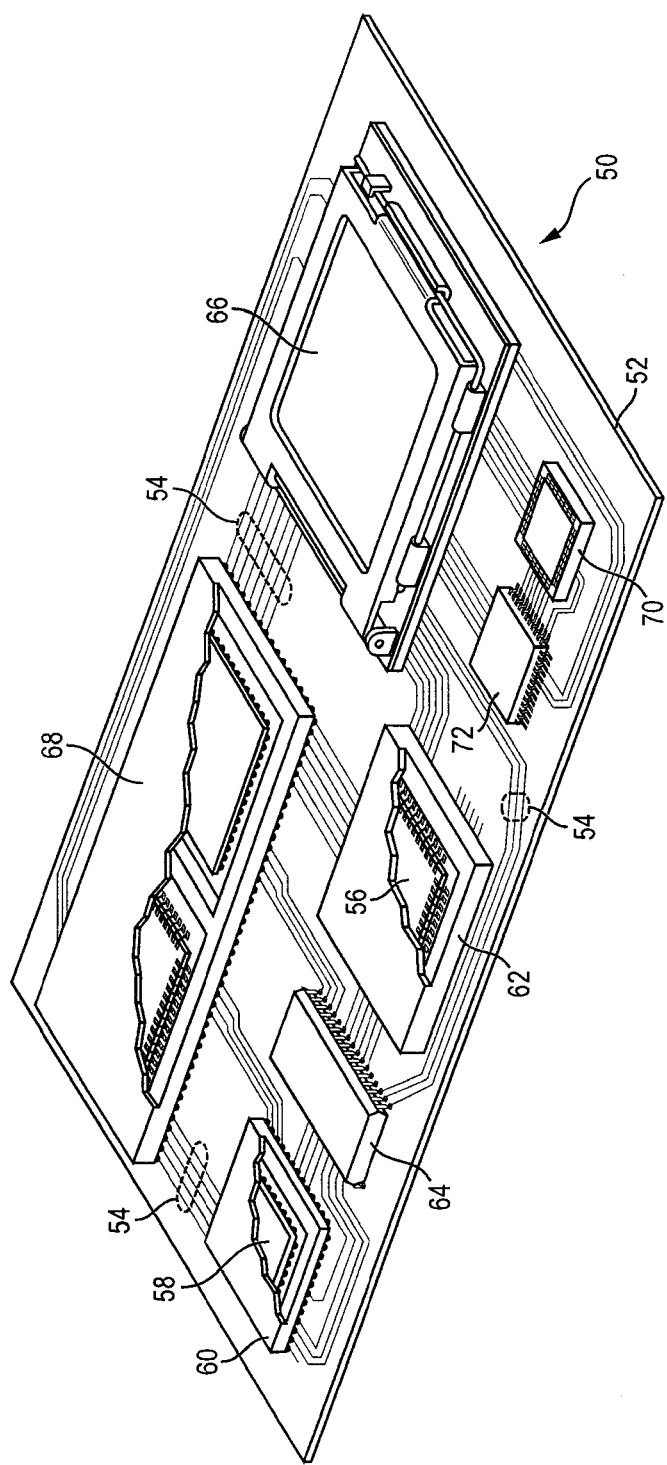
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 2 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 3A:
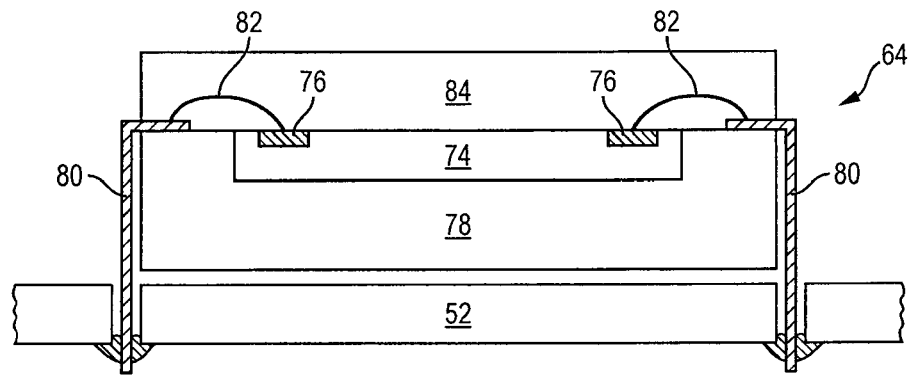
FIGS. 3a-3c illustrate further detail of the representative semiconductor packages mounted to the PCB.
Figure 3B:
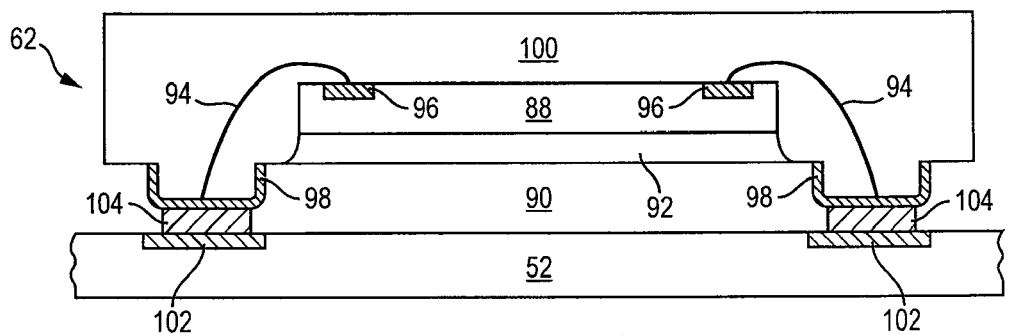
Figure 3C:
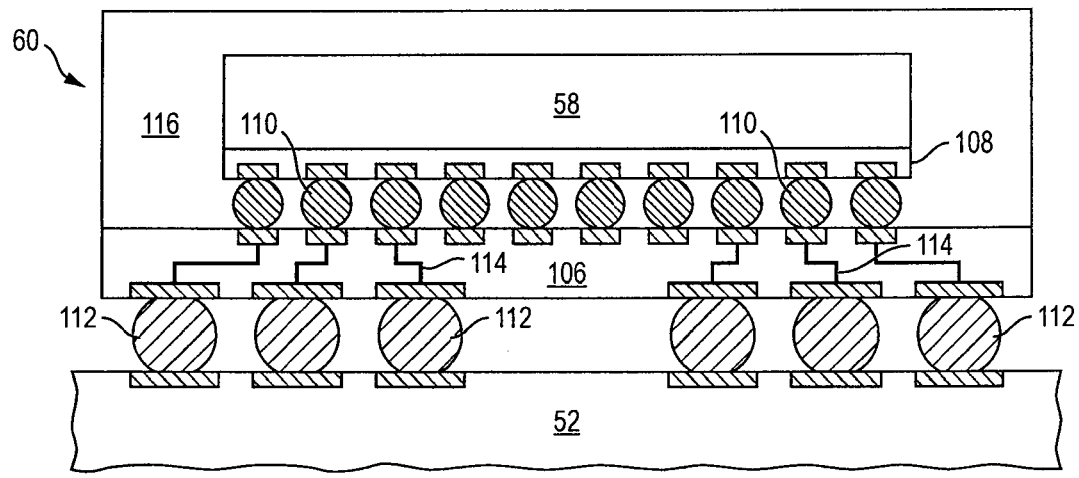

FIGS. 3*a*-3*c* show exemplary semiconductor packages. FIG. 3*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 3*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
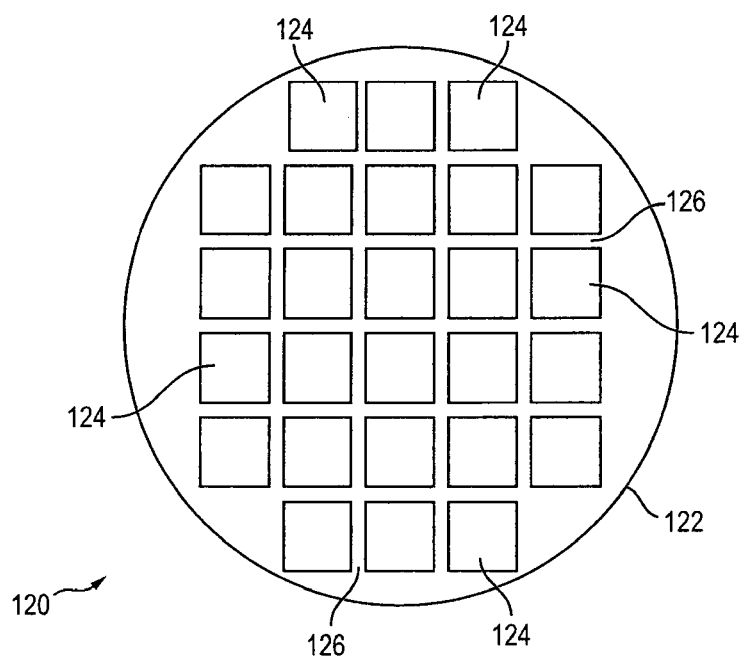

FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126 as described above.

FIG. 4b shows a cross-sectional view of a portion of semiconductor wafer 120. Each semiconductor die 124 has an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain IPDs, such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130.

In FIG. 4c, semiconductor wafer 120 is singulated through saw street 126 using saw blade or laser cutting tool 134 into individual semiconductor die 124. In one embodiment, semiconductor die 124 is a flipchip type semiconductor die.

Figure 5A:
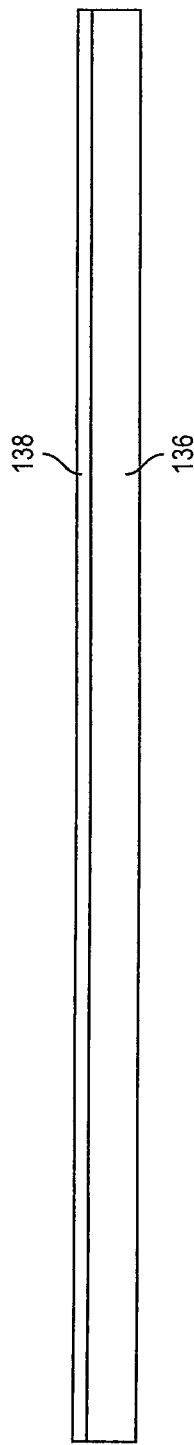
Figure 5B:
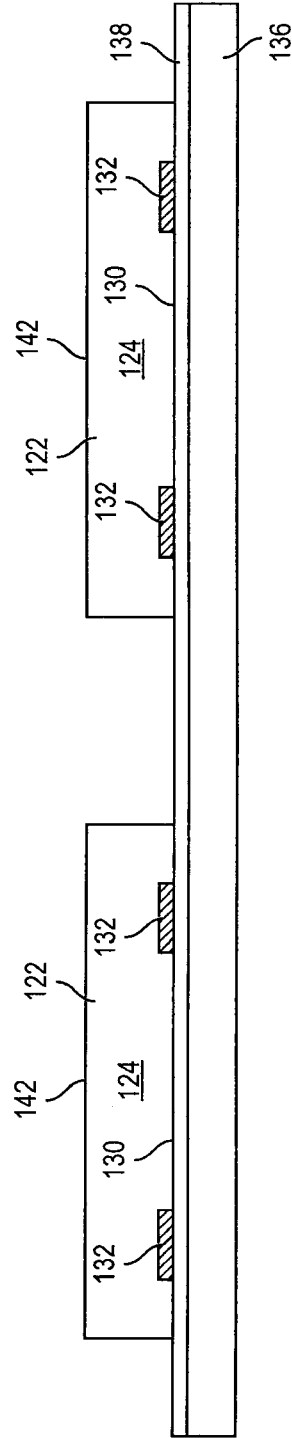

FIGS. 5a-5l illustrate, in relation to FIGS. 2 and 3a-3c, a process of forming channels in a back surface of the semiconductor die for heat dissipation. In FIG. 5a, a temporary substrate or carrier 136 contains temporary or sacrificial base material such as silicon, polymer, polymer composite, metal, ceramic, glass, glass epoxy, beryllium oxide, or other suitable low-cost, rigid material for structural support. An interface layer or tape 138 is applied over carrier 136 as a temporary adhesive bonding film releasable by heat or ultraviolet (UV) light. Following singulation, semiconductor die 124 are mounted to interface layer 138 over carrier 136 using pick and place operation, as shown in FIG. 5b.

Figure 5C:
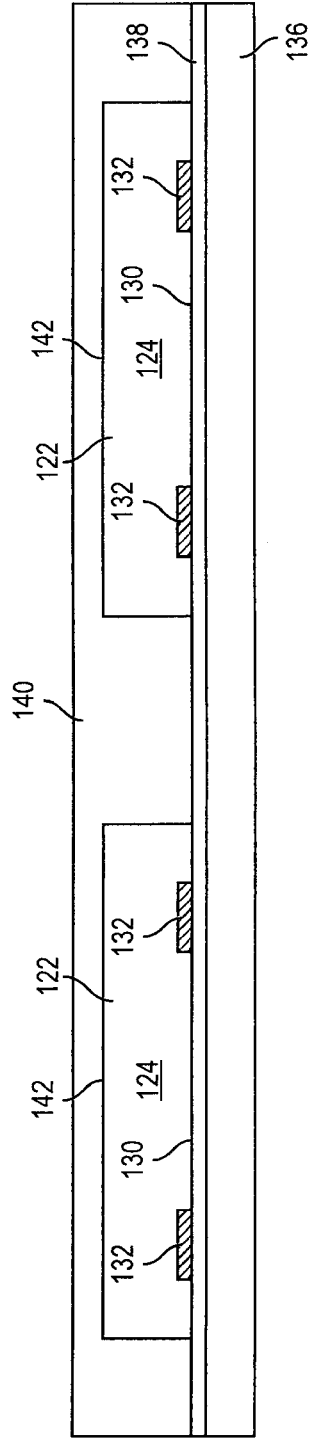

In FIG. 5c, an encapsulant or molding compound 140 is deposited over semiconductor die 124 and carrier 136 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive and environmentally protects the semiconductor device from external elements and contaminants.

Figure 5D:
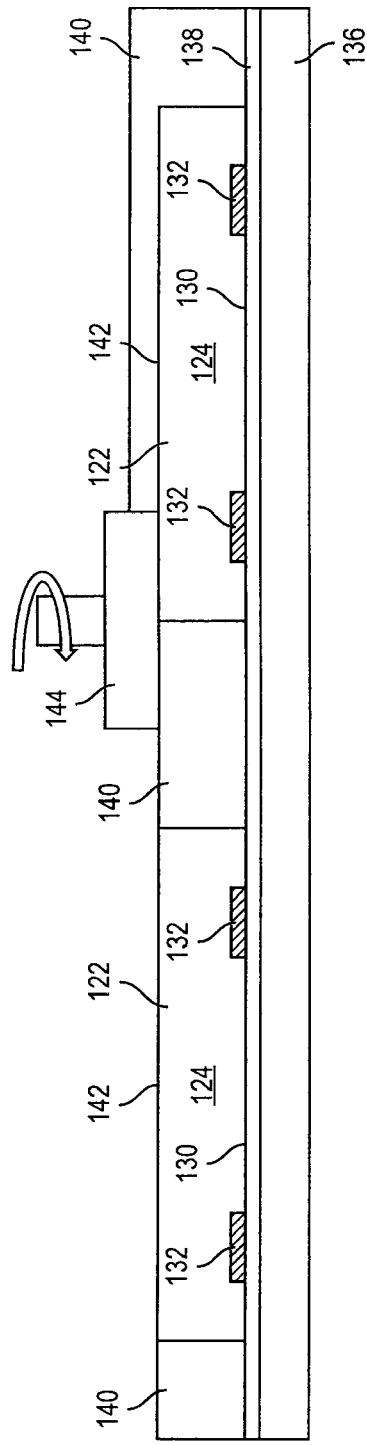
Figure 5E:
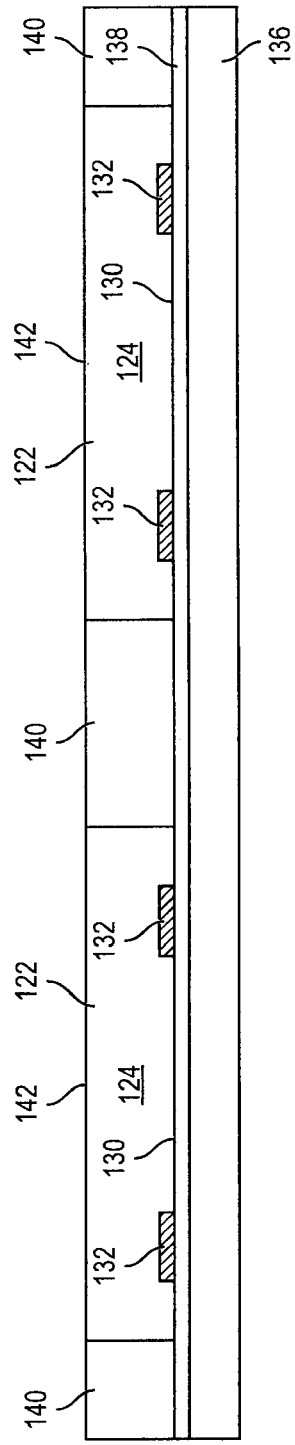

In one embodiment, encapsulant 140 is deposited in an amount that covers back surface 142 of semiconductor die 124, opposite active surface 130. Encapsulant 140 and back surface 142 are planarized by grinder 144 to expose the back surface, as shown in FIG. 5d. Alternatively, the deposition of encapsulant 140 is controlled to deposit the proper amount to leave back surface 142 of semiconductor die 124 exposed, as shown in FIG. 5e. Encapsulant 140 can also be removed by an etching or cleaning process to expose back surface 142. In either case, encapsulant 140 covers side surfaces of semiconductor die 124 and leaves back surface 142 exposed.

Figure 5F:
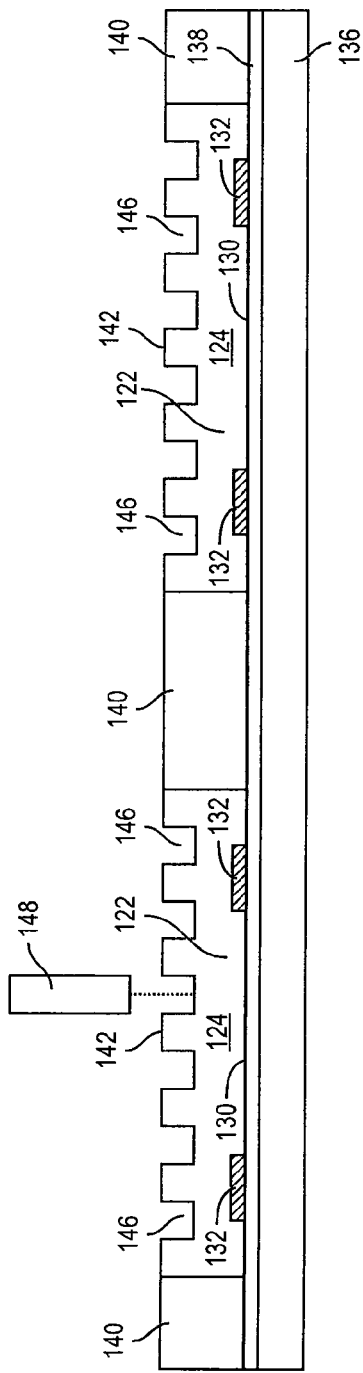

In FIG. 5f, a plurality of grooves or channels 146 is formed in back surface 142 of semiconductor die 124 using saw blade or laser cutting tool 148. Channels 146 can also be formed by etching or mechanical drilling. In one embodiment, channels 146 have a depth of 10-200 micrometers (μm) into back surface 142 of semiconductor die 124. Channels 146 can have a variety of shapes and depths, e.g., through holes, straight lines, or curved lines. Channels 146 can be formed in multiple directions as a crossing pattern.

Figure 5G:
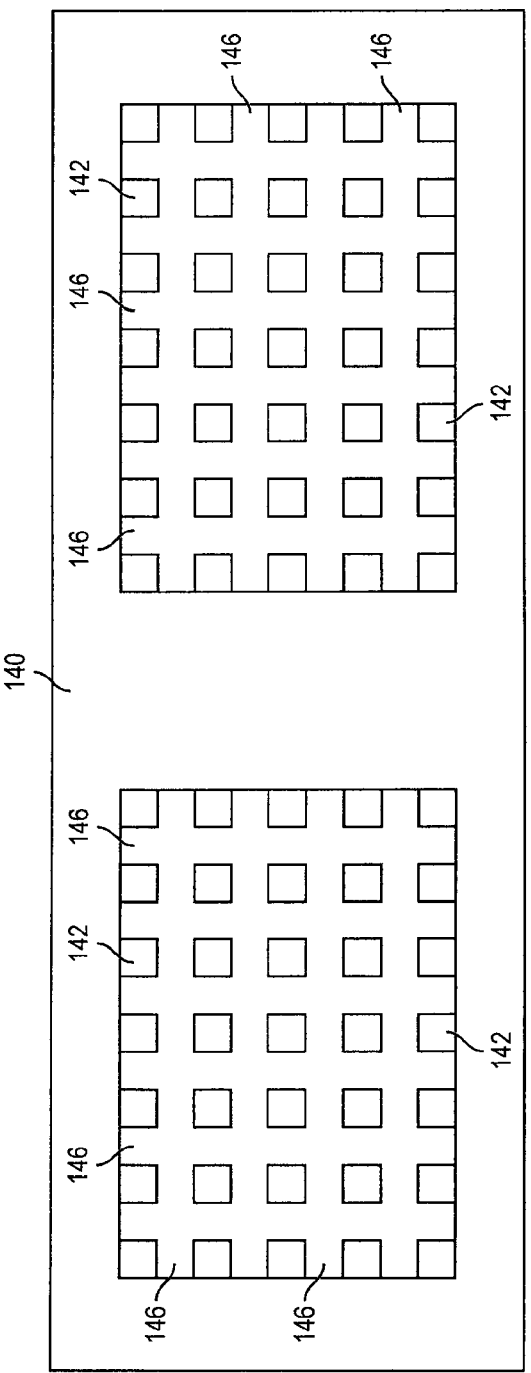
Figure 5H:
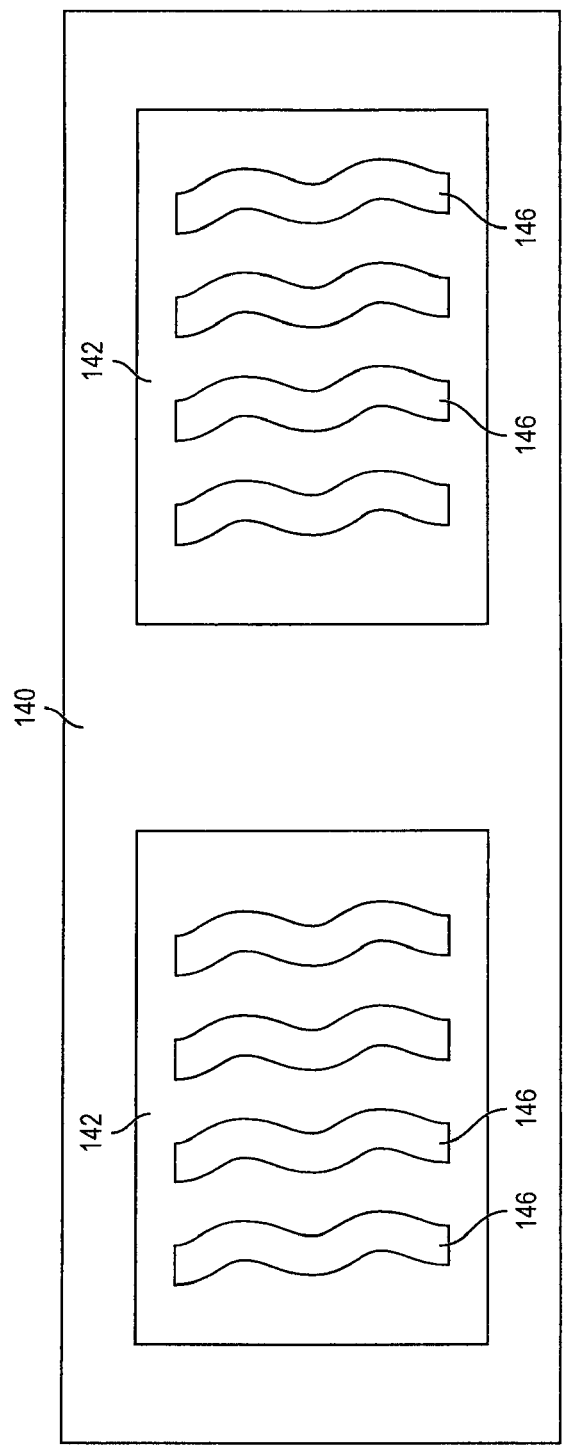

FIG. 5g shows a top view of channels 146 formed in back surface 142 as a crossing pattern. FIG. 5h shows a top view of channels 146 formed in back surface 142 as curved lines.

Channels 146 can also be formed over specific areas of back surface 142 corresponding to hot spots of semiconductor die 124. A thermal analysis of semiconductor die 124 reveals areas of the die where excessive heat is generated, i.e., substantially greater heat than other areas of the die. For example, a power transistor switching high currents would generate high thermal energy, as compared to other areas of the die. A high frequency integrated passive device located in a specific area of semiconductor die 124 can also generate high thermal energy in that area. FIG. 5i shows a top view of channels 146 formed in specific locations corresponding to the excessive heat generating components.

In FIG. 5j, temporary carrier 136 and interface layer 138 are removed by chemical etching, mechanical peel-off, CMP, mechanical grinding, thermal bake, UV light, laser scanning, or wet stripping.

Figure 5K:
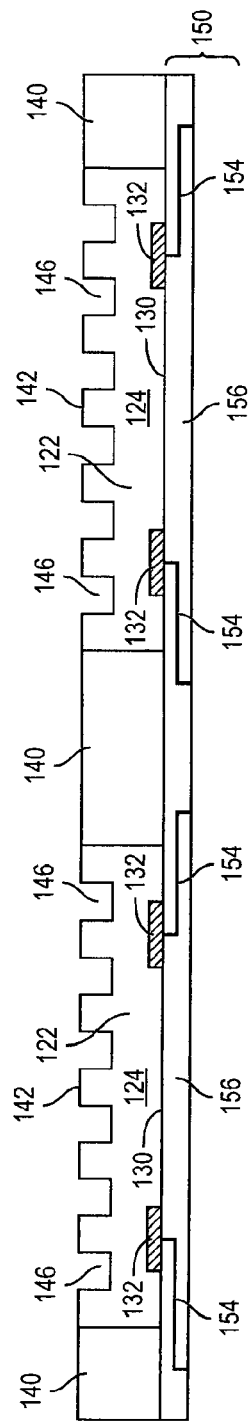

In FIG. 5k, a bottom-side build-up interconnect structure 150 is formed over active surface 130 of semiconductor die 124 and encapsulant 140. The build-up interconnect structure 150 includes an electrically conductive layer 154 formed using a patterning and metal deposition process such as PVD, CVD, sputtering, electrolytic plating, and electroless plating. Conductive layer 154 can be one or more layers of Al, Cu, Sn, Ni, Au, Ag, or other suitable electrically conductive material. One portion of conductive layer 154 is electrically connected to contact pads 132 of semiconductor die 124. Other portions of conductive layer 154 can be electrically common or electrically isolated depending on the design and function of the semiconductor device.

The build-up interconnect structure 150 further includes an insulating or passivation layer 156 formed between conductive layers 154 and containing one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 156 is formed using PVD, CVD, printing, spin coating, spray coating, sintering or thermal oxidation.

Figure 5L:
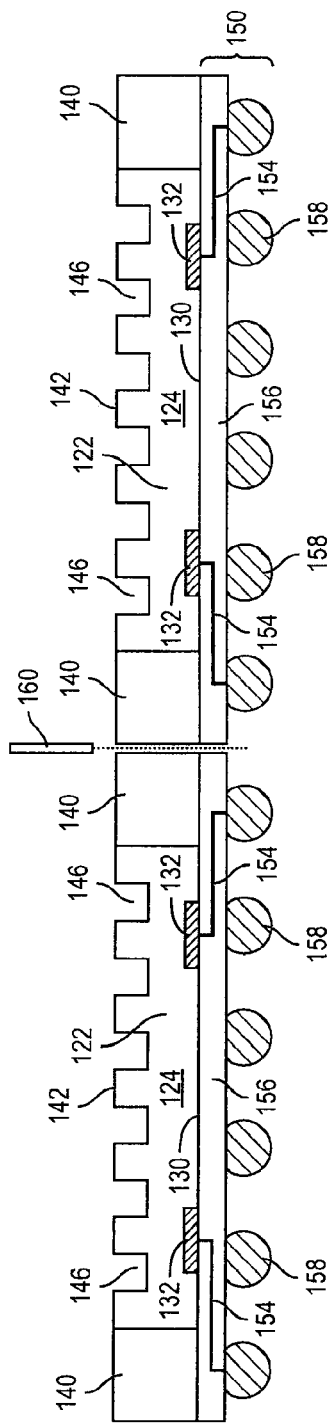

In FIG. 5l, an electrically conductive bump material is deposited over build-up interconnect structure 150 and electrically connected to conductive layer 154 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 154 using a suitable attachment or bonding process. In one embodiment, the bump material is reflowed by heating the material above its melting point to form spherical balls or bumps 158. In some applications, bumps 158 are reflowed a second time to improve electrical contact to conductive layer 154. The bumps can also be compression bonded to conductive layer 154. Bumps 158 represent one type of interconnect structure that can be formed over conductive layer 154. The interconnect structure can also use bond wires, stud bump, micro bump, or other electrical interconnect.

Figure 6:
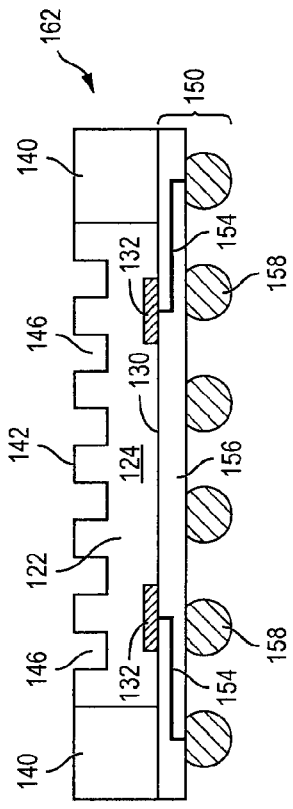
FIG. 6 illustrates the semiconductor die with channels formed in its back surface and bottom-side build-up interconnect structure.

Semiconductor die 124 are singulated with saw blade or laser cutting device 160 into individual semiconductor devices. FIG. 6 shows FO-WLCSP 162 after singulation. Semiconductor die 124 is electrically connected to build-up interconnect structure 150 and bumps 158. Channels 146 provide effective heat dissipation of semiconductor die 124 by exposing a greater surface area of base semiconductor material 122. In particular, channels 146 can be formed in heat sensitive areas of semiconductor die 124, for example around high current carrying circuits or high-speed circuits.

In another embodiment, continuing from FIG. 4b, grooves or channels 170 are formed in back surface 142 of semiconductor die 124 prior to singulation, i.e., while in wafer form, as shown in FIG. 7a. Channels 170 can also be formed by etching or mechanical drilling. In one embodiment, channels 170 have a depth of 10-200 µm into back surface 142 of semiconductor die 124. Channels 170 can have a variety of shapes and depths, e.g., through holes, straight lines, or curved lines. Channels 170 can be formed in multiple directions as a crossing pattern.

Channels 170 can also be formed over specific areas of back surface 142 corresponding to hot spots of semiconductor die 124, as described in FIG. 5i. A thermal analysis of semiconductor die 124 reveals areas of the die where excessive heat is generated, i.e., substantially greater heat than other areas of the die. For example, a power transistor switching high currents would generate high thermal energy, as compared to other areas of the die. A high frequency integrated passive device located in a specific area of semiconductor die 124 can also generate high thermal energy in that area.

In FIG. 7b, semiconductor wafer 120 is singulated through saw street 126 using saw blade or laser cutting tool 174 into individual semiconductor die 124 with channels 170.

Figure 8A:
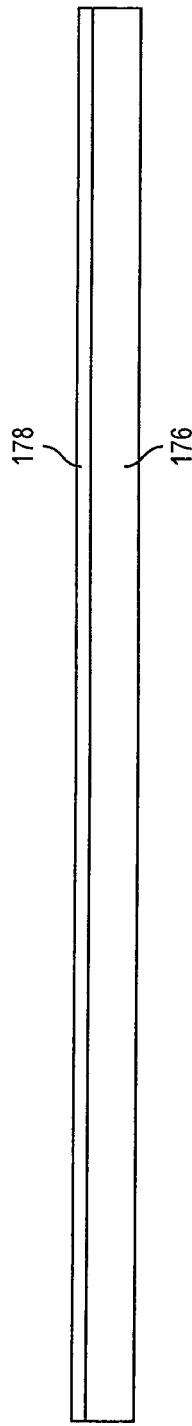
FIGS. 8a-8e illustrate forming an encapsulant and bottom-side build-up interconnect structure over the semiconductor die with channels formed in its back surface.
Figure 8B:
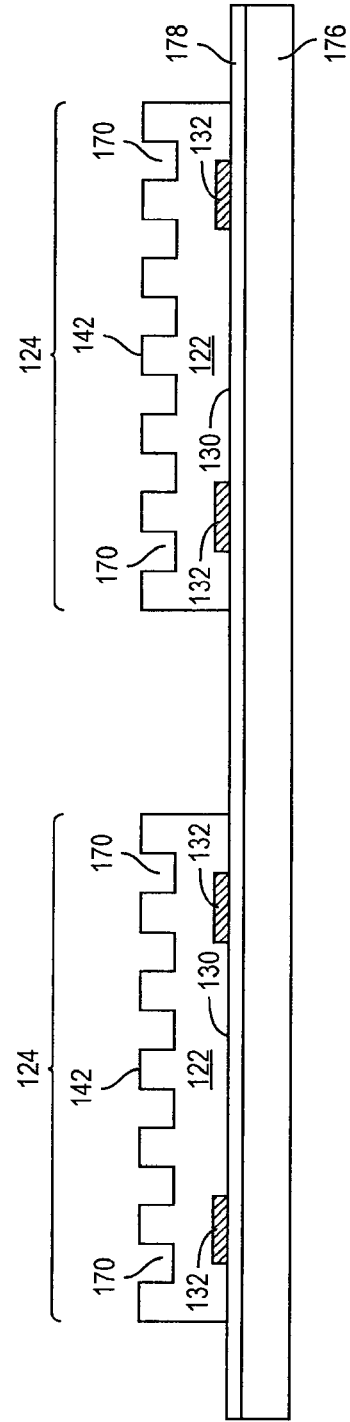

In FIG. 8a, a temporary substrate or carrier 176 contains temporary or sacrificial base material such as silicon, polymer, polymer composite, metal, ceramic, glass, glass epoxy, beryllium oxide, or other suitable low-cost, rigid material for structural support. An interface layer or tape 178 is applied over carrier 176 as a temporary adhesive bonding film releasable by heat or UV light. Following singulation, semiconductor die 124 with channels 170 are mounted to interface layer 178 over carrier 176 using pick and place operation, as shown in FIG. 8b.

An encapsulant or molding compound 180 is deposited over semiconductor die 124, channels 170, and carrier 176 using a paste printing, compressive molding, transfer molding, liquid encapsulant molding, vacuum lamination, spin coating, or other suitable applicator. Encapsulant 180 can be polymer composite material, such as epoxy resin with filler, epoxy acrylate with filler, or polymer with proper filler. Encapsulant 180 is non-conductive and environmentally protects the semiconductor device from external elements and contaminants.

In one embodiment, encapsulant 180 is deposited in an amount that covers channels 170 in back surface 142 of semiconductor die 124. A portion of encapsulant 180 is removed by planarization, etching, or cleaning process to expose channels 170, similar to FIG. 5d. Alternatively, the deposition of encapsulant 180 is controlled to deposit the proper amount to leave channels 170 exposed. In either case, encapsulant 180 covers side surfaces of semiconductor die 124 and leaves channels 170 exposed.

Figure 8C:
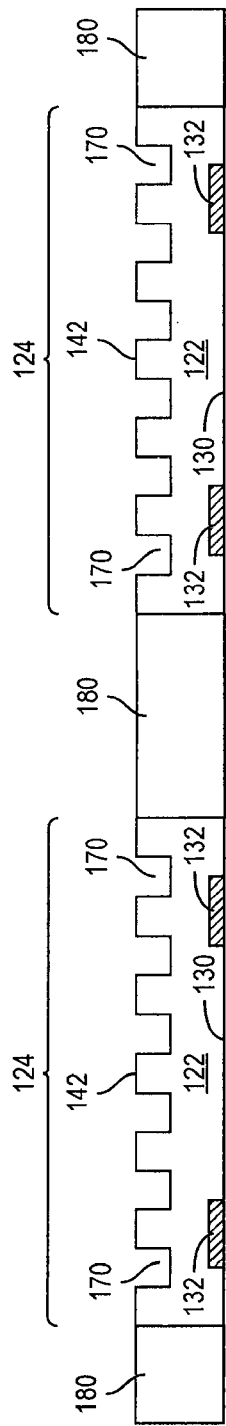
Figure 8D:
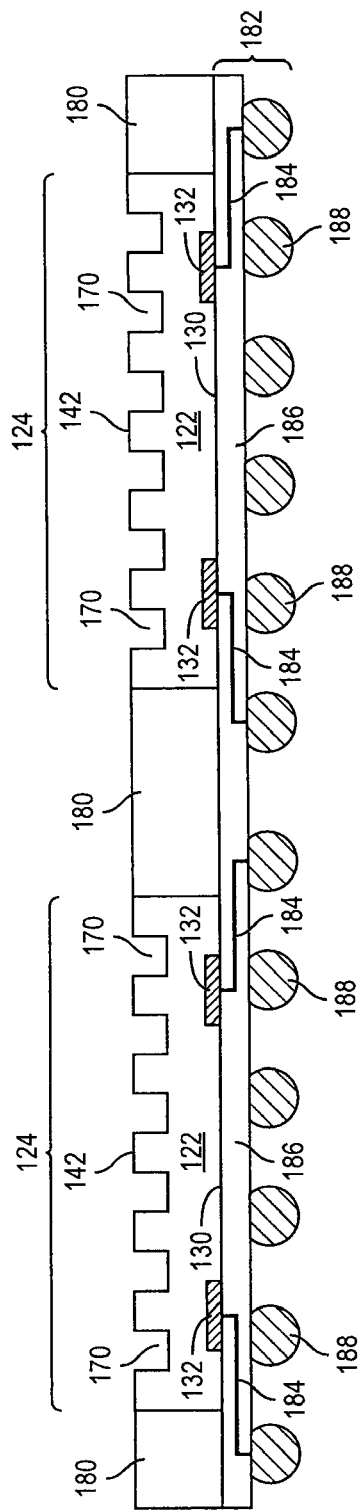

In FIG. 8c, temporary carrier 176 and interface layer 178 are removed by chemical etching, mechanical peel-off, CMP, mechanical grinding, thermal bake, UV light, laser scanning, or wet stripping. In FIG. 8d, a bottom-side build-up interconnect structure 182, with conductive layers 184 separated by insulating layer 186, and bumps 188 are formed over semiconductor die 124 and encapsulant 180, similar to FIGS. 5k and 5l.

Figure 8E:
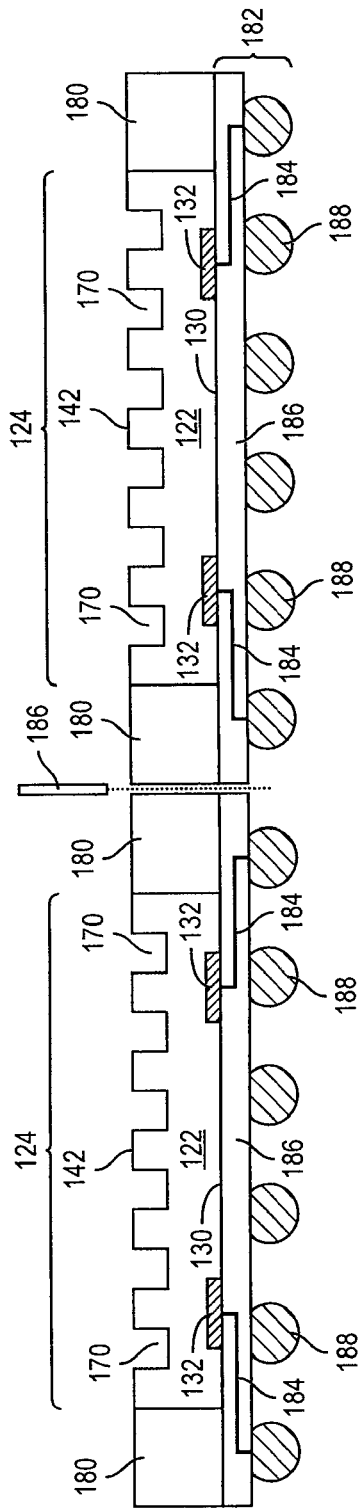

In FIG. 8e, semiconductor die 124 are singulated with saw blade or laser cutting device 186 into individual semiconductor devices. Semiconductor die 124 is electrically connected to build-up interconnect structure 182 and bumps 188. Channels 170 provide effective heat dissipation of semiconductor die 124 by exposing a greater surface area of base semiconductor material 122. In particular, channels 170 can be formed in heat sensitive areas of semiconductor die 124, for example around high current carrying circuits or high-speed circuits.

Figure 9:
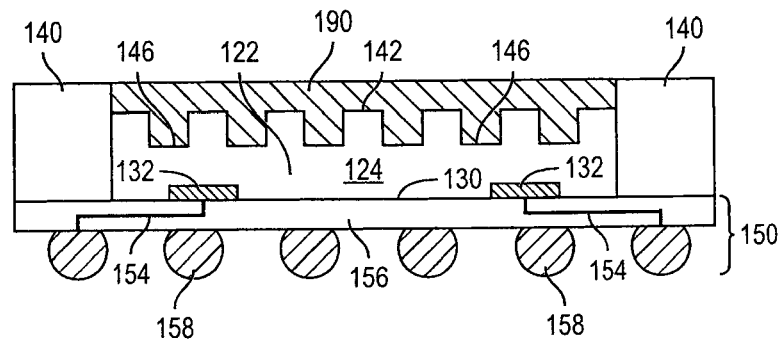
FIG. 9 illustrates a heat sink formed over the channels.

FIG. 9 shows an embodiment, continuing from FIG. 6, with heat sink or heat spreader 190 formed over channels 146 and back surface 142 of semiconductor die 124. Heat sink 190 can be Al, Cu, or another material with high thermal conductivity to provide heat dissipation for semiconductor die 124.

Figure 10:
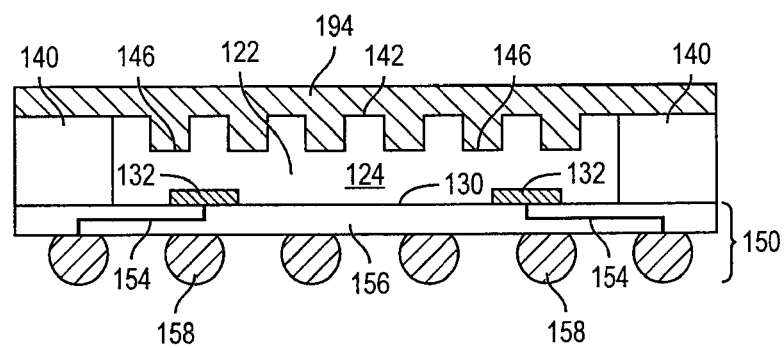
FIG. 10 illustrates the heat sink formed over the channels and top surface of the encapsulant.

FIG. 10 shows an embodiment, continuing from FIG. 6, with heat sink or heat spreader 194 formed over the top surface of encapsulant 140, as well as channels 146 and back surface 142 of semiconductor die 124. Heat sink 194 can be Al, Cu, or another material with high thermal conductivity to provide heat dissipation for semiconductor die 124.

Figure 11:
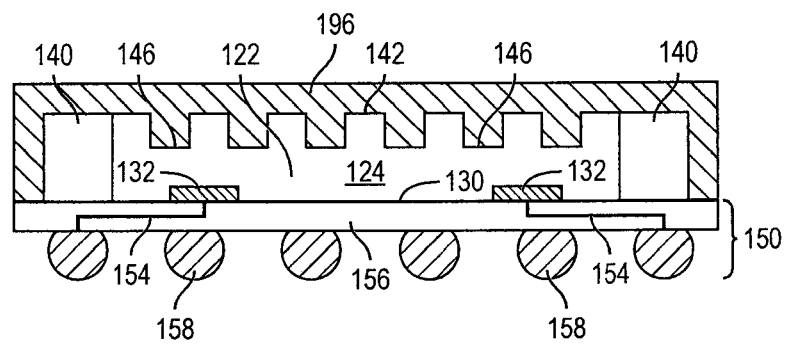
FIG. 11 illustrates the heat sink formed over the channels and top and side surfaces of the encapsulant.

FIG. 11 shows an embodiment, continuing from FIG. 6, with heat sink or heat spreader 196 formed over the top surface and sides of encapsulant 140, as well as channels 146 and back surface 142 of semiconductor die 124. Heat sink 196 can be Al, Cu, or another material with high thermal conductivity to provide heat dissipation for semiconductor die 124.

Figure 12:
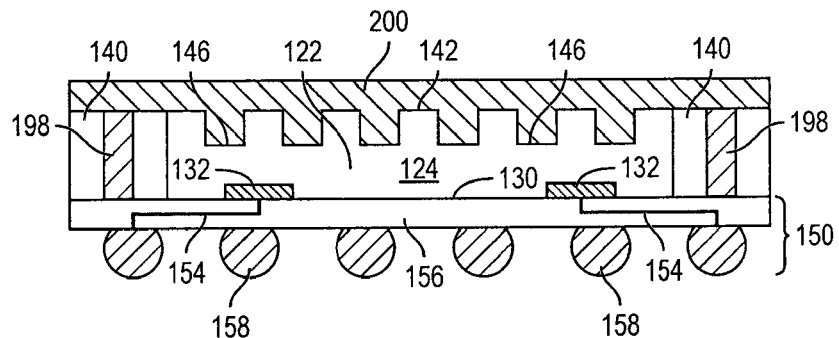
FIG. 12 illustrates the heat sink formed over the channels and top surface of the encapsulant with conductive vias formed through the encapsulant.

FIG. 12 shows an embodiment, continuing from FIG. 6, with conductive vias 198 formed through encapsulant 140. A plurality of vias is formed through encapsulant 140 using laser drilling, mechanical drilling, or deep reactive ion etching (DRIE). The vias are filled with Al, Cu, Sn, Ni, Au, Ag, Ti, W, poly-silicon, or other suitable electrically conductive material using electrolytic plating, electroless plating process, or other suitable metal deposition process to form conductive vias 198. Conductive vias 198 provide additional vertical interconnect for semiconductor die 124. A heat sink or heat spreader 200 is formed over the top surface of encapsulant 140 and conductive vias 198, as well as channels 146 and back surface 142 of semiconductor die 124. Heat sink 200 can be Al, Cu, or another material with high thermal conductivity to provide heat dissipation for semiconductor die 124.

Figure 13:
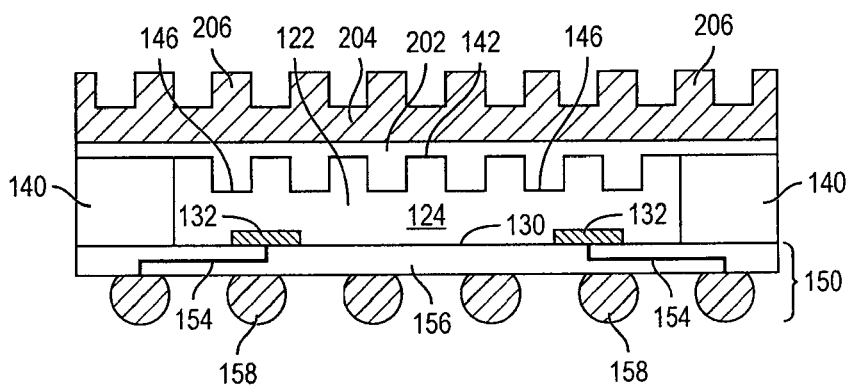
FIG. 13 illustrates a TIM and heat sink formed over the channels and encapsulant.

FIG. 13 shows an embodiment, continuing from FIG. 6, with a thermal interface material (TIM) 202 formed over encapsulant 140 and channels 146 and back surface 142 of semiconductor die 124. TIM 202 can be aluminum oxide, zinc oxide, boron nitride, or pulverized silver. A heat sink or heat spreader 204 is formed over TIM 202. Heat sink 204 can be Al, Cu, or another material with high thermal conductivity to provide heat dissipation for semiconductor die 124. Heat sink 204 includes a plurality of fins 206 to increase its heat dissipating surface area. TIM 202 aids in the distribution and dissipation of heat generated by semiconductor die 124.

Figure 14:
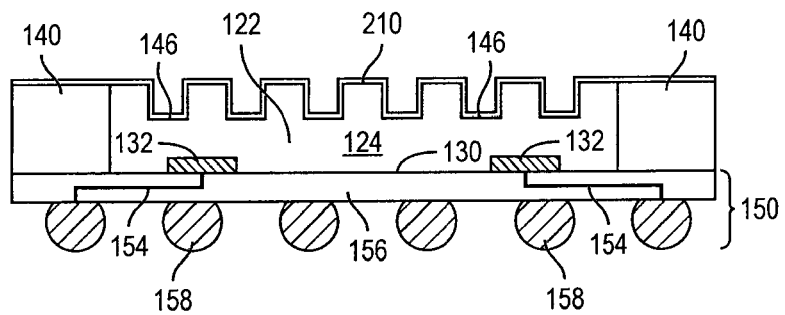
FIG. 14 illustrates the conformal plating layer formed over the channels and encapsulant.

FIG. 14 shows an embodiment, continuing from FIG. 6, with a conformal plating layer 210 formed over channels 146 and back surface 142 of semiconductor die 124. The conformal plating layer 210 can be Al, Cu, or another material with high thermal conductivity to provide heat dissipation for semiconductor die 124.

Figure 15:
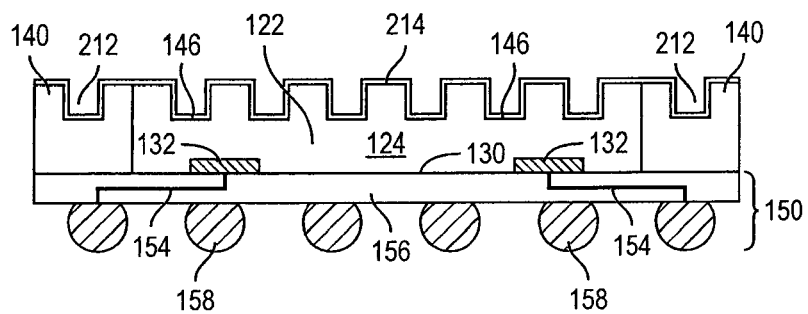
FIG. 15 illustrates the conformal plating layer formed over channels in the semiconductor die and channels in the encapsulant.

FIG. 15 shows an embodiment, continuing from FIG. 6, with channels 212 formed in encapsulant 140. A conformal plating layer 214 is formed over encapsulant 140 and channels 212, as well as channels 146 and back surface 142 of semiconductor die 124. The conformal plating layer 214 can be Al, Cu, or another material with high thermal conductivity to provide heat dissipation for semiconductor die 124.

Figure 16:
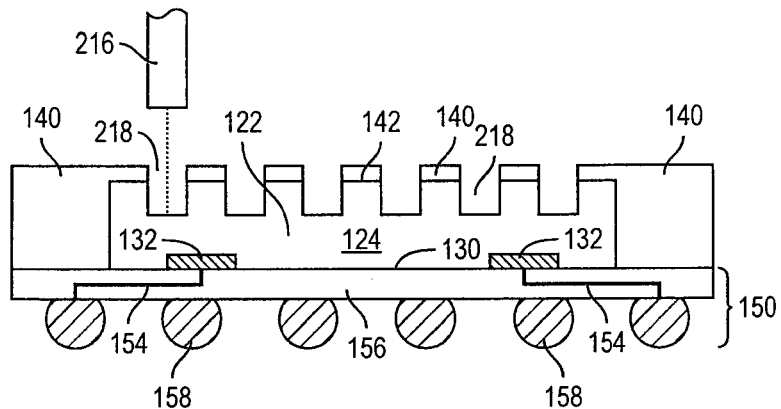
FIG. 16 illustrates encapsulant formed over the back surface of the semiconductor die and channels formed through the encapsulant and semiconductor die.

FIG. 16 shows an embodiment with encapsulant 140 covering back surface 142 of semiconductor die 124, similar to FIG. 5c. A portion of encapsulant 140 and back surface 142 is removed by saw blade or laser cutting tool 216 to form channels 218, while leaving the encapsulant over the back surface.

Figure 17:
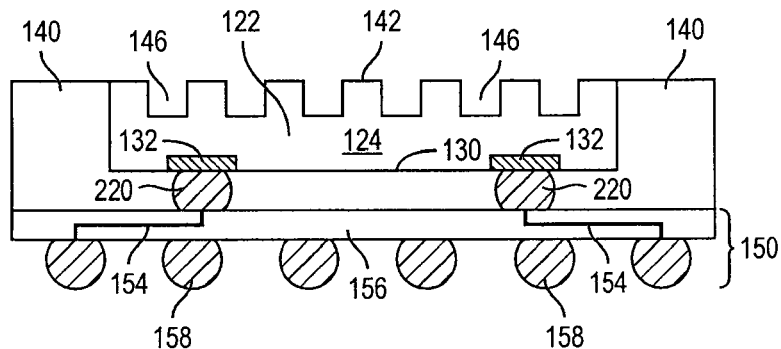
FIG. 17 illustrates bumps formed between the semiconductor die and interconnect structure.

FIG. 17 shows an embodiment, similar to FIG. 6, with bumps 220 formed between contact pads 132 and conductive layer 154 of build-up interconnect structure 150.

Figure 18:
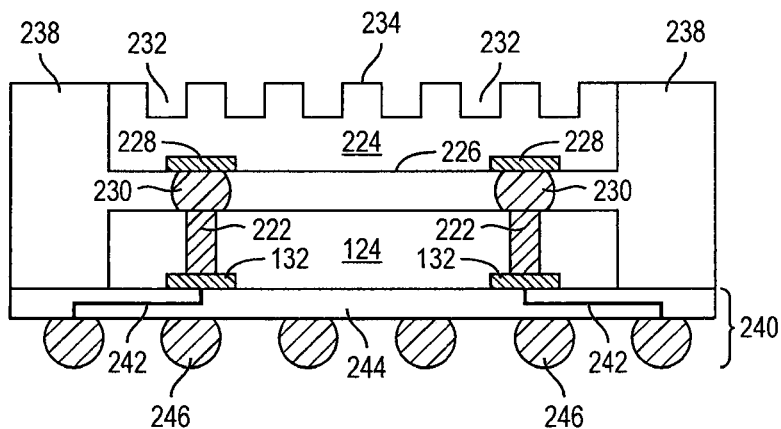
FIG. 18 illustrates the semiconductor die with channels mounted to a second semiconductor die which is mounted to the interconnect structure.

FIG. 18 shows an embodiment, continuing from FIG. 5b, with semiconductor die 124 mounted to the temporary substrate and interface layer. A plurality of vias is formed through semiconductor die 124 using laser drilling, mechanical drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form conductive through silicon vias (TSV) 222.

A semiconductor die 224 has an active surface 226 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 226 to implement analog circuits or digital circuits, such as DSP, ASIC, memory, or other signal processing circuit. Semiconductor die 224 may also contain IPDs, such as inductors, capacitors, and resistors, for RF signal processing. Contact pads 228 are formed over active surface 226. A plurality of bumps 230 is formed over contact pads 228. Semiconductor die 224 with bumps 230 is mounted over semiconductor die 124 to conductive TSV 222.

A plurality of grooves or channels 232 is formed in back surface 234 of semiconductor die 224 using a saw blade or laser cutting tool, similar to FIG. 5f. Channels 232 can also be formed by etching or mechanical drilling. In one embodiment, channels 232 have a depth of 10-200 μm into back surface 234 of semiconductor die 224. Channels 232 can have a variety of shapes and depths, e.g., through holes, straight lines, or curved lines. Channels 232 can be formed in multiple directions as a crossing pattern, see FIGS. 5g and 5h.

Channels 232 can also be formed over specific areas of back surface 234 corresponding to hot spots of semiconductor die 224, similar to FIG. 5i. A thermal analysis of semiconductor die 224 reveals areas of the die where excessive heat is generated, i.e., substantially greater heat than other areas of the die. For example, a power transistor switching high currents would generate high thermal energy, as compared to other areas of the die. A high frequency integrated passive device located in a specific area of semiconductor die 224 can also generate high thermal energy in that area.

An encapsulant or molding compound 238 is deposited over semiconductor die 124 and 224 using a paste printing, compressive molding, transfer molding, liquid encapsulant molding, vacuum lamination, spin coating, or other suitable applicator. Encapsulant 238 can be polymer composite material, such as epoxy resin with filler, epoxy acrylate with filler, or polymer with proper filler. Encapsulant 238 is non-conductive and environmentally protects the semiconductor device from external elements and contaminants.

In one embodiment, encapsulant 238 is deposited in an amount that covers channels 232 in back surface 234 of semiconductor die 224. A portion of encapsulant 238 is removed by planarization, etching, or cleaning process to expose channels 232, similar to FIG. 5d. Alternatively, the deposition of encapsulant 238 is controlled with the proper amount to leave channels 232 exposed. In either case, encapsulant 238 covers side surfaces of semiconductor die 124 and 224 and leaves channels 232 exposed.

The temporary carrier is removed by chemical etching, mechanical peel-off, CMP, mechanical grinding, thermal bake, UV light, laser scanning, or wet stripping. A bottom-side build-up interconnect structure 240, with conductive layers 242 separated by insulating layer 244, and bumps 246 are formed over semiconductor die 124 and encapsulant 238, similar to FIGS. 5k and 5l. Semiconductor die 124 and 224 are singulated with a saw blade or laser cutting device into individual semiconductor devices. Semiconductor die 124 and 224 are electrically connected to through bumps 230 and conductive TSV 222 to build-up interconnect structure 240 and bumps 246. Channels 232 provide effective heat dissipation of semiconductor die 224 by exposing a greater surface area of the base semiconductor material. In particular, channels 232 can be formed in heat sensitive areas of semiconductor die 224, for example around high current carrying circuits or high-speed circuits.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die including an active surface;
   depositing an insulating material over a second surface of the semiconductor die opposite the active surface and around the first semiconductor die;
   planarizing a surface of the insulating material to the second surface of the first semiconductor die;
   forming a channel in the second surface of the first semiconductor die;
   forming a conductive via through the insulating material around the first semiconductor die;
   forming a heat sink extending into the channel and over the surface of the insulating material and contacting the conductive via; and
   forming an interconnect structure over the insulating material and first semiconductor die and contacting the conductive via.

2. The method of claim 1, further including singulating the first semiconductor die through the insulating material.

3. The method of claim 1, further including forming the channel over a heat generating area of the first semiconductor die.

4. The method of claim 1, further including forming a plurality of bumps between the first semiconductor die and interconnect structure.

* * * * *